(12) United States Patent
Lin et al.

(10) Patent No.: US 9,275,958 B2
(45) Date of Patent: Mar. 1, 2016

(54) CHIP PACKAGE AND METHOD FOR FORMING THE SAME

(71) Applicant: XINTEC INC., Jhongli, Taoyuan County (TW)

(72) Inventors: Yi-Min Lin, New Taipei (TW); Yi-Ming Chang, Pingzhen (TW); Shu-Ming Chang, New Taipei (TW); Yen-Shih Ho, Kaohsiung (TW); Tsang-Yu Liu, Zhubei (TW); Chia-Ming Cheng, New Taipei (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/207,224

(22) Filed: Mar. 12, 2014

(65) Prior Publication Data

US 2014/0264785 A1 Sep. 18, 2014

Related U.S. Application Data

(60) Provisional application No. 61/782,375, filed on Mar. 14, 2013.

(51) Int. Cl.
*H01L 27/146* (2006.01)
*H01L 23/552* (2006.01)
(Continued)

(52) U.S. Cl.
CPC .......... *H01L 23/552* (2013.01); *H01L 21/4814* (2013.01); *H01L 21/78* (2013.01); *H01L 24/02* (2013.01); *H01L 24/92* (2013.01); *H01L 29/0657* (2013.01); *H01L 24/05* (2013.01); *H01L 24/45* (2013.01); *H01L 24/48* (2013.01); *H01L 24/85* (2013.01); *H01L 25/0657* (2013.01); *H01L 2224/0235* (2013.01); *H01L 2224/0239* (2013.01); *H01L 2224/02313* (2013.01); *H01L 2224/04042* (2013.01); *H01L 2224/05548* (2013.01); *H01L 2224/05571* (2013.01);
(Continued)

(58) Field of Classification Search
CPC ... H01L 23/552; H01L 21/78; H01L 21/4814; H01L 23/48; H01L 2224/05548; H01L 24/92; H01L 2924/10157; H01L 2924/13091; H01L 24/02
USPC ......... 257/659, 690, 734, 784, 294, 435, 508; 438/617, 732, 113, 731
See application file for complete search history.

(56) References Cited

U.S. PATENT DOCUMENTS

2013/0285240 A1* 10/2013 Last ...................... H01L 23/481
257/738

FOREIGN PATENT DOCUMENTS

TW 201232684 8/2012
TW 201301494 1/2013

*Primary Examiner* — Jarrett Stark
*Assistant Examiner* — Shahed Ahmed
(74) *Attorney, Agent, or Firm* — Liu & Liu (57) ABSTRACT

An embodiment of the invention provides a chip package which includes: a semiconductor substrate having a first surface and a second surface; a first recess extending from the first surface towards the second surface; a second recess extending from a bottom of the first recess towards the second surface, wherein a sidewall and the bottom of the first recess and a second sidewall and a second bottom of the second recess together form an exterior side surface of the semiconductor substrate; a wire layer disposed over the first surface and extending into the first recess and/or the second recess; an insulating layer positioned between the wire layer and the semiconductor substrate; and a metal light shielding layer disposed over the first surface and having at least one hole, wherein a shape of the at least one hole is a quadrangle.

15 Claims, 7 Drawing Sheets

(51) Int. Cl.
*H01L 21/48* (2006.01)
*H01L 21/78* (2006.01)
*H01L 29/06* (2006.01)
*H01L 23/00* (2006.01)
H01L 25/065 (2006.01)

(52) U.S. Cl.
CPC . *H01L2224/451* (2013.01); *H01L 2224/48225* (2013.01); *H01L 2224/48227* (2013.01); *H01L 2224/92* (2013.01); *H01L 2924/10156* (2013.01); *H01L 2924/10157* (2013.01); *H01L 2924/13091* (2013.01); *H01L 2924/1461* (2013.01)

CHIP PACKAGE AND METHOD FOR FORMING THE SAME

CROSS REFERENCE TO RELATED APPLICATIONS

This Application claims the benefit of U.S. Provisional Application No. 61/782,375 filed on Mar. 14, 2013, the entirety of which is incorporated by reference herein.

BACKGROUND

1. Field of the Disclosure

The disclosure relates to a chip package, and in particular to a chip package formed by a wafer-level packaging process.

2. Description of the Related Art

A packaging process for chip packages is one important step in forming electronic products. A chip package not only provides the chips with protection from environmental contaminants, but it also provides an electrical connection interface for internal electronic elements and the chips packaged therein.

Because the demands for the size reduction of electronic products continue, finding ways to dispose more conducting routes in a limited space becomes an important issue. In addition, there is also a need to prevent the operation of the chip package from being affected by external light.

BRIEF SUMMARY OF THE DISCLOSURE

An embodiment of the invention provides a chip package which includes: a semiconductor substrate having a first surface and a second surface; a first recess extending from the first surface towards the second surface; a second recess extending from a bottom of the first recess towards the second surface, wherein a sidewall and the bottom of the first recess and a second sidewall and a second bottom of the second recess together form an exterior side surface of the semiconductor substrate; a wire layer disposed over the first surface and extending into the first recess and/or the second recess; an insulating layer positioned between the wire layer and the semiconductor substrate; and a metal light shielding layer disposed over the first surface and having at least one hole, wherein a shape of the at least one hole is a quadrangle.

An embodiment of the invention provides a chip package which includes: a semiconductor substrate having a first surface and a second surface; a first recess extending from the first surface towards the second surface; a second recess extending from a bottom of the first recess towards the second surface, wherein a sidewall and the bottom of the first recess and a second sidewall and a second bottom of the second recess together form an exterior side surface of the semiconductor substrate; a wire layer disposed over the first surface and extending into the first recess and/or the second recess; an insulating layer positioned between the wire layer and the semiconductor substrate; and a metal light shielding layer disposed over the first surface and having at least one hole, wherein a shape of the at least one hole is a triangle, a pentagon, a hexagon, or a heptagon.

An embodiment of the invention provides a method for forming a chip package, which includes: providing at least one semiconductor substrate having a first surface and a second surface; removing a portion of the semiconductor substrate from the first surface to form a first recess and a second recess, wherein the first recess extends towards the second surface, and the second recess extends from a bottom of the first recess towards the second surface; forming an insulating layer over the first surface, wherein the insulating layer extends into the first recess and the second recess; forming a wire layer over the insulating layer, wherein the wire layer extends into the first recess and/or the second recess; forming a metal light shielding layer over the insulating layer, wherein the metal light shielding layer has at least one hole, and a shape of the at least one hole is a quadrangle; and performing a dicing process along at least one predetermined scribe line of the semiconductor substrate to form at least one chip package, wherein a sidewall and the bottom of the first recess and a second sidewall and a second bottom of the recess together form an exterior side surface of the semiconductor substrate after the dicing process.

A detailed description is given in the following embodiments with reference to the accompanying drawings.

BRIEF DESCRIPTION OF THE DRAWINGS

The present disclosure can be more fully understood by reading the subsequent detailed description and examples with references made to the accompanying drawings.

DETAILED DESCRIPTION OF THE DISCLOSURE

The making and using of various embodiments of the disclosure are discussed in detail below. It should be appreciated, however, that the various embodiments can be embodied in a wide variety of specific contexts. The specific embodiments discussed are merely illustrative, and do not limit the scope of the disclosure.

It should be understood that the following disclosure provides many different embodiments, or examples, for implementing different features of the disclosure. Specific examples of components and arrangements are described below to simplify the present disclosure. These are merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows include embodiments in which the first and second features are formed in direct contact, and may also include embodiments in which additional features may be formed between the first and second features, such that the first and second features may not be in direct contact.

A chip package according to an embodiment of the present invention may be used to package a variety of chips. For example, the chip package of the embodiments of the invention may be applied to active or passive devices, or electronic components with digital or analog circuits, such as optoelectronic devices, micro-electro-mechanical-systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, ink printer heads, or power MOSFET modules.

The wafer scale package process mentioned above mainly means that after the package process is accomplished during the wafer stage, the wafer with chips is cut to obtain separate independent packages. However, in a specific embodiment, separate independent chips may be redistributed overlying a supporting wafer and then be packaged, which may also be referred to as a wafer scale package process. In addition, the aforementioned wafer scale package process may also be adapted to form chip packages of multi-layer integrated circuit devices by stacking a plurality of wafers having integrated circuits. In one embodiment, the diced package is a chip scale package (CSP). The size of the chip scale package (CSP) may be only slightly larger than the size of the packaged chip. For example, the size of the chip package is not larger than 120% of the size of the packaged chip.

Figure 1A:
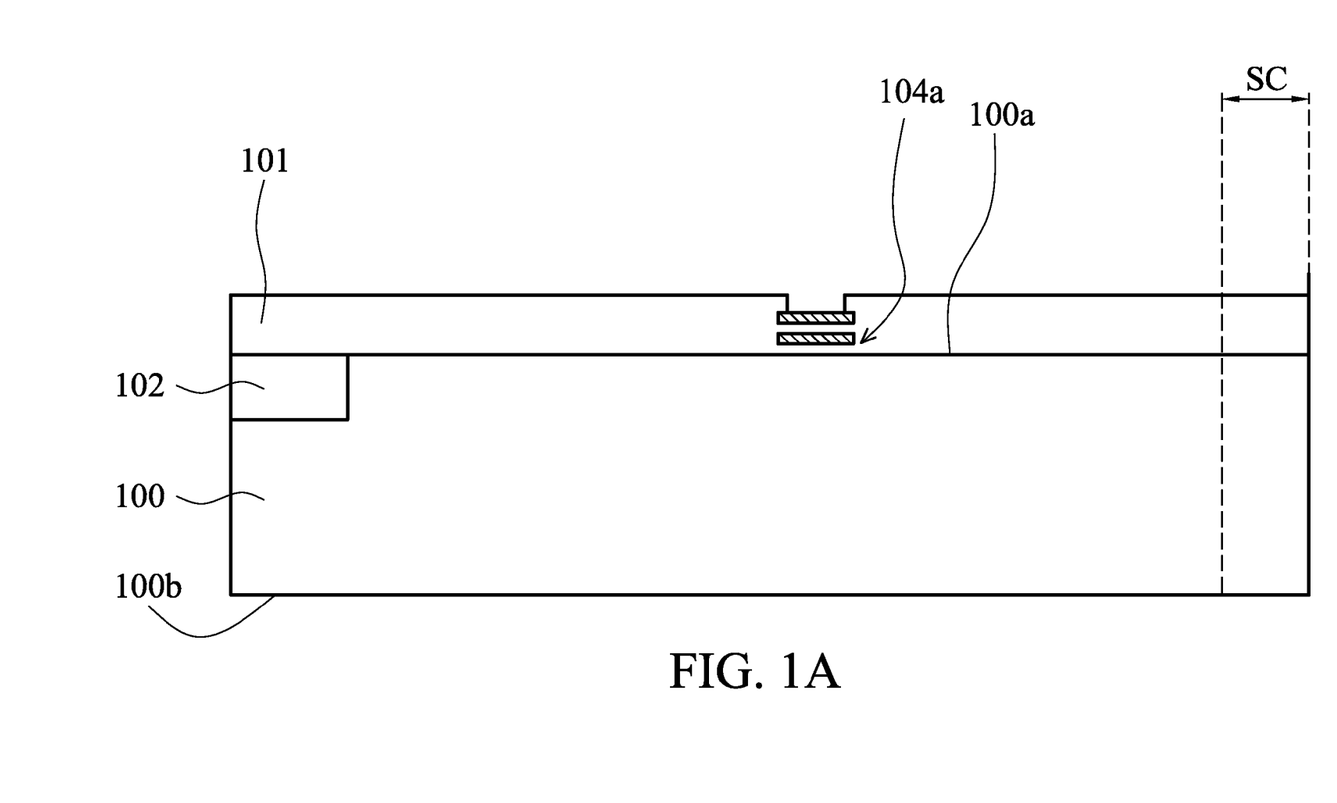
FIGS. 1A-1D are cross-sectional views showing the steps of forming a chip package according to an embodiment of the present invention.

FIGS. 1A-1D are cross-sectional views showing the steps of forming a chip package according to an embodiment of the present invention. As shown in FIG. 1A, a semiconductor substrate 100 is provided, which has a surface 100a and a surface 100b. The semiconductor substrate 100 includes, for example, a silicon substrate, a silicon germanium substrate, another suitable semiconductor substrate, or a combination thereof. In one embodiment, the semiconductor substrate 100 is a semiconductor wafer (such as a silicon wafer). Therefore, a wafer-level packaging process may be performed to reduce fabrication cost and fabrication time. There may be at least one predetermined scribe line SC defined in the semiconductor substrate 100. In subsequent processes, the semiconductor substrate 100 may be diced along the predetermined scribe line SC to form a plurality of chip packages separated from each other.

A device region 102 may be formed in the semiconductor substrate 100. In the device region 102, active or passive devices, or electronic components with digital or analog circuits, such as opto electronic devices, micro electro mechanical systems (MEMS), micro fluidic systems, and physical sensors for detecting heat, light, or pressure, may be formed. In one embodiment, image sensor devices are formed in the device region 102. Alternatively, light-emitting diodes (LEDs), solar cells, RF circuits, accelerators, gyroscopes, micro actuators, surface acoustic wave devices, pressure sensors, ink printer heads, or power MOSFET modules may be formed in the device region 102.

A dielectric layer 101 may be formed over the surface 100a of the semiconductor substrate 100. The material of the dielectric layer 101 may include (but not be limited to) silicon oxide, silicon nitride, silicon oxynitride, or a combination thereof. A plurality of conducting pads 104a may be formed in the dielectric layer 101. Each of the conducting pads 104a may include a stack of multiple conducting layers. The conducting pad 104a may be electrically connected to the corresponding element in the device region 102 through an interconnect structure (not shown) in the dielectric layer 101. In other words, the conducting pad 104 is electrically connected to the device region 102, which may be used for input and/or output of electrical signals. In one embodiment, a portion of the dielectric layer 101 may be removed to expose the conducting pad 104a.

Figure 1B:
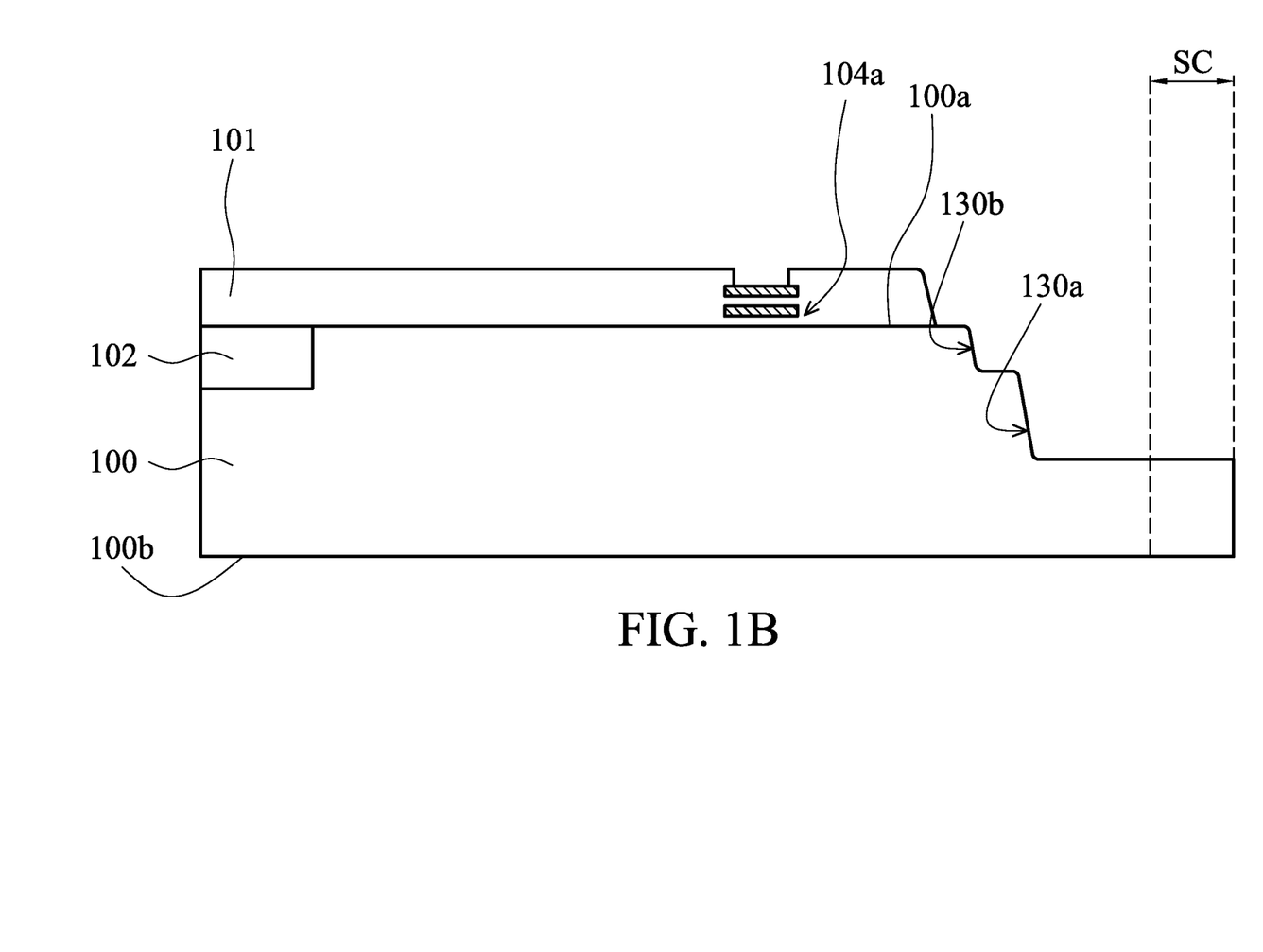

As shown in FIG. 1B, in one embodiment, through a patterning process and/or a dicing process, a portion of the semiconductor substrate 100 may be removed to form a plurality of recesses. These recesses may extend from the surface 100a towards the surface 100b and connect with each other. In addition, sidewalls and bottoms of these recesses may together form an exterior side surface of the semiconductor substrate 100 after the dicing process subsequently performed along the predetermined scribe line SC. That is, a portion of the exterior side surface of the semiconductor substrate 100 is together constructed by the sidewalls and the bottoms of the recesses after the dicing process. In the embodiment shown in FIG. 1B, two recesses 130b and 130a are taken as an example for illustration. However, it should be appreciated that in another embodiment, the semiconductor substrate 100 may have three or more recesses connecting with each other, and the bottoms and the sidewalls of these recesses may together form the exterior side surface of the semiconductor substrate after the dicing process.

As shown in FIG. 1B, the recess 130b may extend from the surface 100a towards the surface 100b of the semiconductor substrate 100. The recess 130a may extend from the bottom of the recess 130b towards the surface 100b. The sidewall and the bottom of the recess 130b and the sidewall and the bottom of the recess 130a may together form an exterior side surface of the semiconductor substrate 100 after the subsequent dicing process performed along the predetermined scribe line SC.

Figure 1C:
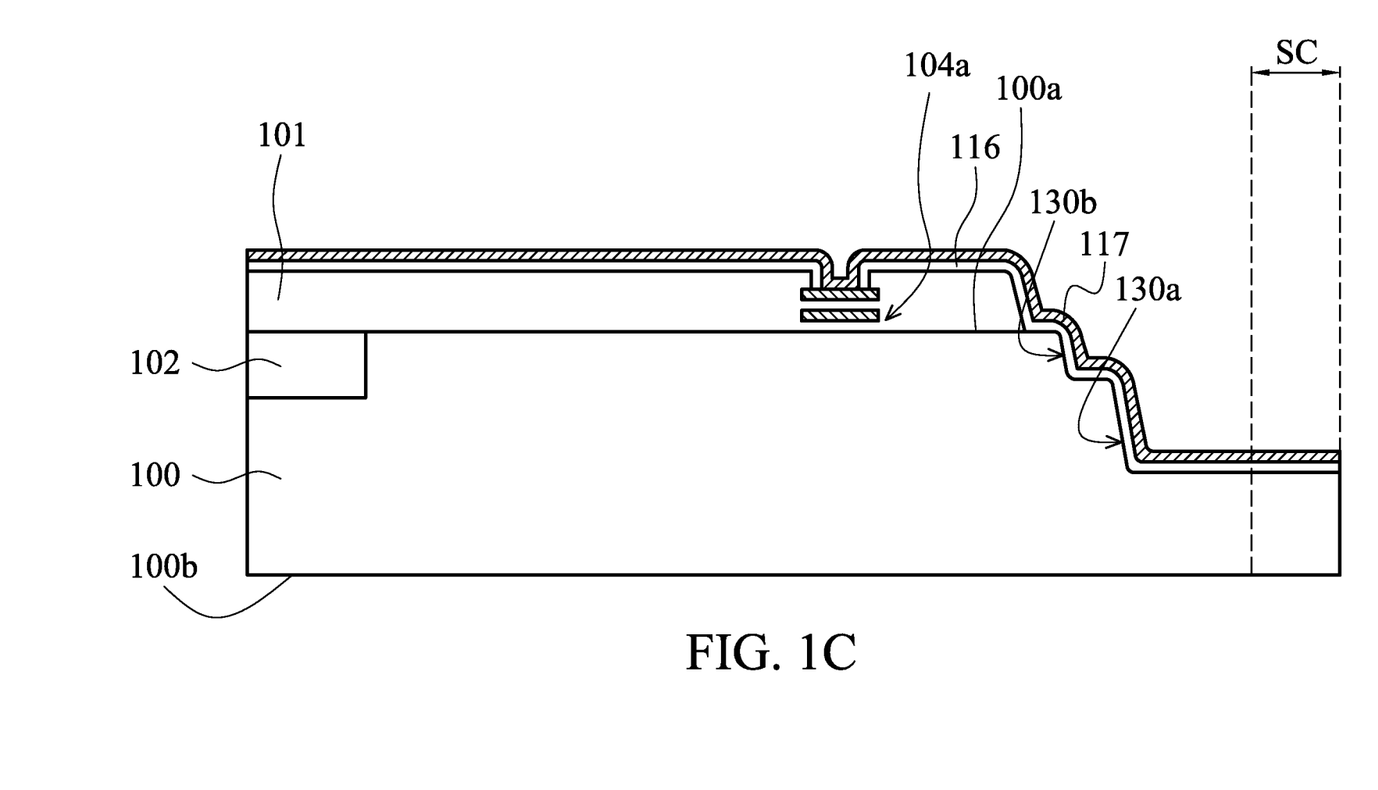

Afterwards, as shown in FIG. 1C, an insulating layer 116 may be formed over the surface 100a of the semiconductor substrate 100. The insulating layer 116 may extend into the recess 130b and the recess 130a. In one embodiment, the insulating layer 116 may be formed conformally on the sidewalls and the bottoms of the recess 130b and the recess 130a. In one embodiment, the insulating layer 116 may be formed using a chemical vapor deposition process, a spin-on process, a spraying process, a thermal oxidation process, a nitridation process, other suitable processes, or a combination thereof. The material of the insulating layer 116 may include (but not be limited to) silicon oxide, silicon nitride, silicon oxynitride, a polymer material, or a combination thereof. The insulating layer 116 may have openings which expose the conducting pad 104a.

Afterwards, a metal layer 117 may be formed over the insulating layer 116 over the surface 100a of the semiconductor substrate 100. The material of the metal layer 117 may include (but not be limited to) copper, aluminum, gold, platinum, nickel, tin, titanium, or a combination thereof. In one embodiment, the metal layer 117 may include an aluminum copper layer (which may have a thickness such as 1.2 µm) and a seed layer. The seed layer is, for example, a titanium layer or a titanium tungsten (TiW) layer. The metal layer 117 may extend into the recess 130b and/or the recess 130a. For example, in one embodiment, the metal layer 117 may extend over the sidewall and the bottom of the recess 130b, and further extend over the sidewall and the bottom of the recess 130a, as shown in FIG. 1C.

Figure 1D:
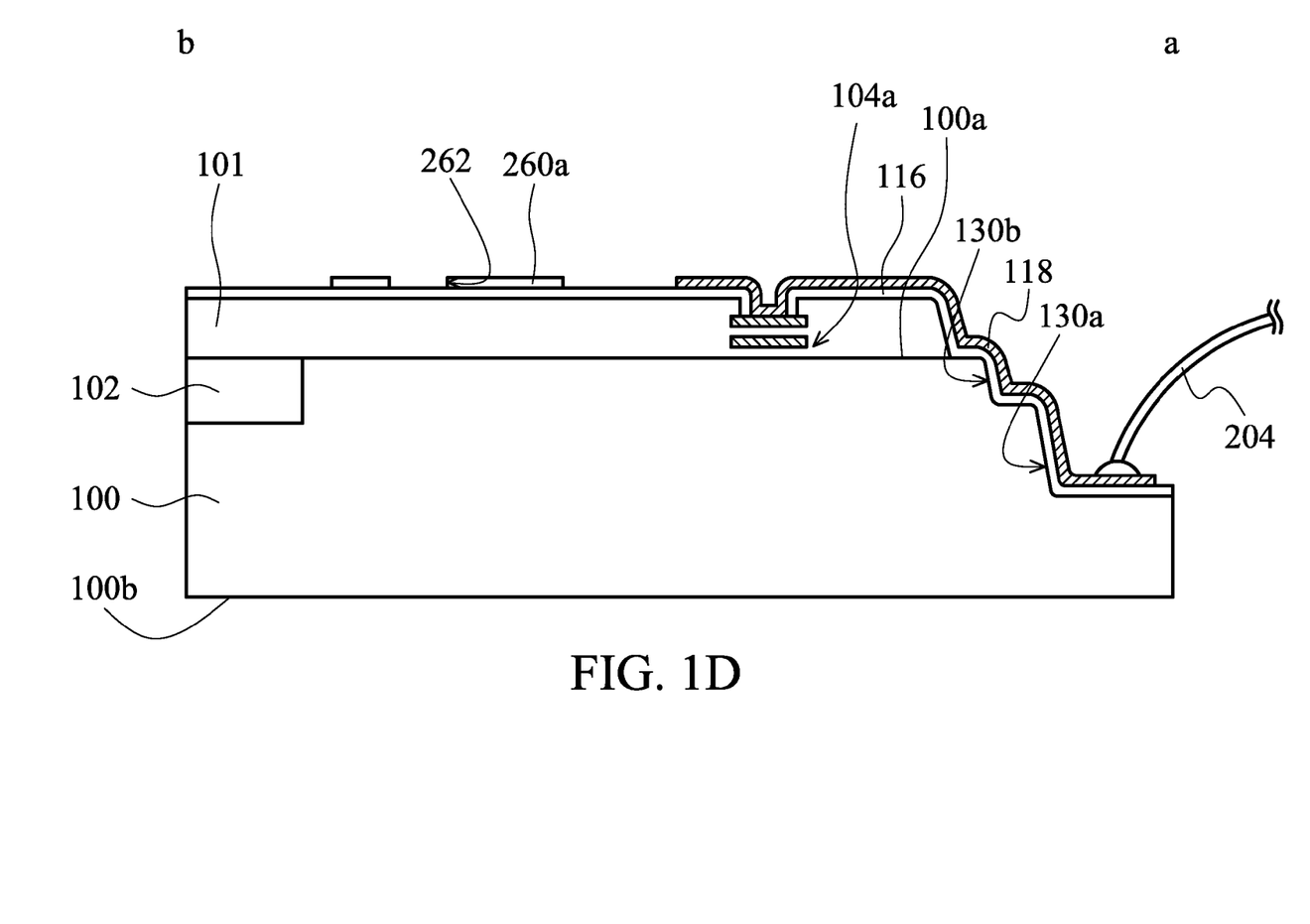

Afterwards, as shown in FIG. 1D, the metal layer 117 is patterned to form at least one wire layer 118. In one embodiment, the wire layer 118 may be electrically connected to the conducting pad 104a and extend into the recess 130b and/or the recess 130a. In one embodiment, a plurality of wire layers may be electrically connected to corresponding conducting pads 104a, respectively, and extend over the bottom of the recess 130a.

Figure 2:
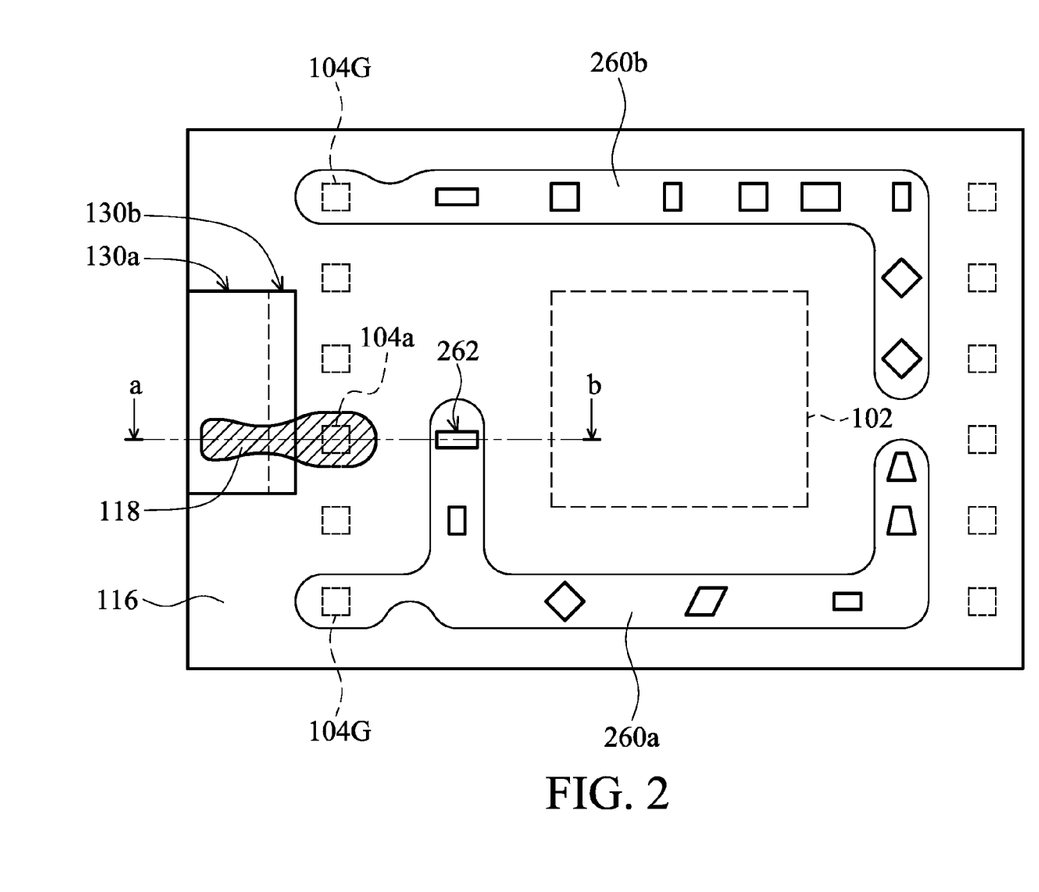
FIG. 2 is a top view of a chip package according to an embodiment of the present invention.

FIG. 2 is a top view of a chip package according to an embodiment of the present invention, wherein the same or similar reference numbers are used to designate the same or similar element. FIG. 1D may correspond to the cross-sectional view taken along the line a-b in FIG. 2. As shown in FIG. 2 and FIG. 1D, the wire layer 118 may electrically contact with the exposed conducting pad 104a through the openings of the insulating layer 116 and the dielectric layer 101. Although only one wire layer 118 is shown in FIG. 2, more wire layers 118 may be formed over the insulating layer 116, and may be electrically and respectively connected to corresponding conducting pads 104a and extend over the bottom of the recess 130a. In another embodiment, other recesses not connected with the recesses 130b and 130a may be formed in the semiconductor substrate 100, wherein some of the wire layers 118 may also extend into the other recesses. In other words, in another embodiment, different wire layers may extend into different recesses.

As shown in FIG. 2 and FIG. 1D, in one embodiment, a metal light shielding layer 260a and/or a metal light shielding layer 260b may be formed over the insulating layer 116 over the surface 100a of the semiconductor substrate 100. Alternatively, in another embodiment, more metal shielding layers may be formed. The metal light shielding layer 260a and/or the metal light shielding layer 260b may not electrically contact with the wire layer 118. In one embodiment, the projection(s) of the metal light shielding layer 260a and/or the metal light shielding layer 260b on the surface 100a may be positioned between the projection of the device region 102 on the surface 100a and the projection of the conducting pad 104a on the surface 100a. The metal light shielding layer 260a and/or the metal light shielding layer 260b may be used to block a portion of the external light from irradiating the device region 102 and affecting the operation of the device region 102. In one embodiment, the metal light shielding layer 260a and/or the metal light shielding layer 260b may be electrically connected to a ground conducting pad 104G in the dielectric layer 101 optionally through openings of the insulating layer 116 and the dielectric layer 101.

As shown in FIG. 2, the width of the metal light shielding layer 260a or the metal light shielding layer 260b is usually relatively large, thus it intends easily to have higher internal stress such that defects may be induced. In one embodiment, in order to reduce the internal stress in the metal light shielding layer 260a or the metal light shielding layer 260b, a stress release pattern may be formed in the metal light shielding layer 260a or the metal light shielding layer 260b, which may be, for example, holes formed in the metal light shielding layer.

As shown in FIG. 2 and FIG. 1D, the metal light shielding layer 260a or the metal light shielding layer 260b may have at least one hole 262. In one embodiment, a portion of the metal light shielding layer 260a or the metal light shielding layer 260b may be removed by a patterning process to form the hole 262. The hole 262 may, for example, penetrate through the metal light shielding layer 260a. However, embodiments of the present invention are not limited thereto. In another embodiment, the hole 262 does not penetrate through the metal light shielding layer 260a completely.

In one embodiment, the metal light shielding layer 260a may be formed over the insulating layer 116 by using another deposition process and another patterning process after the wire layer 118 is formed. Alternatively, in another embodiment, the metal light shielding layer 260a and the wire layer 118 may be formed simultaneously. For example, in one embodiment, both the metal light shielding layer 260a and the wire layer 118 may be formed by patterning the metal layer 117. In this case, the material of the metal light shielding layer 260a may be the same as the material of the wire layer 118. In one embodiment, the thickness of the metal light shielding layer 260a may be the same as the thickness of the wire layer 118. In one embodiment, the metal light shielding layer 260a, the hole in the metal light shielding layer 260a, and the wire layer 118 are formed simultaneously.

Figure 3:
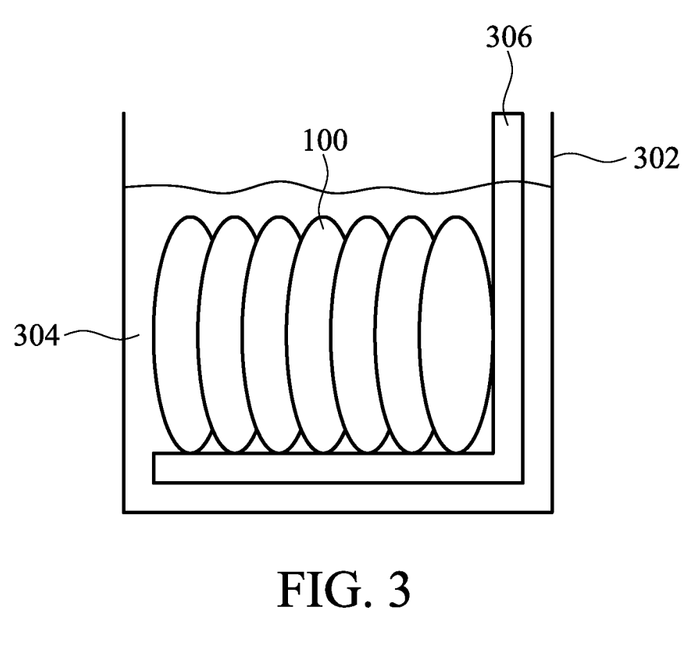
FIG. 3 is a cross-sectional view showing a step of forming a chip package according to an embodiment of the present invention.

FIG. 3 is a cross-sectional view showing a step of forming a chip package according to an embodiment of the present invention, wherein the same or similar reference numbers are used to designate the same or similar elements. As shown in FIG. 3, a container 302 may be provided, and an etching liquid 304 may be disposed therein. Afterwards, a plurality of semiconductor substrates similar to the semiconductor substrate 100 shown in FIG. 1C may be provided, and photoresist layers having desired patterns may be formed over the surfaces of the semiconductor substrates 100. Then, the plurality of semiconductor substrates 100 may be disposed on a carrier 306 and dipped into the etching liquid 304 to pattern the metal layers 107 into a plurality of wire layers 118 and at least one metal light shielding layer 206a having at least one hole 262. Therefore, the wire layers and the metal light shielding layers over a plurality of semiconductor substrates (or wafers) may be defined simultaneously, which may reduce the fabrication time and cost. In one embodiment, the carrier 306 may be raised up and lowered down repeatedly. That is, the dipping of the semiconductor substrates 100 in the etching liquid may be performed repeatedly to finish the patterning of the metal layer 117.

In one embodiment, the shape of the hole 262 of the metal light shielding layer 260a is designed to be a quadrangle. Therefore, the etching liquid or the bubbles generated during the etching of the metal layer 107 by the etchant may be removed more easily. As a result, the patterning of the metal layer 117 may be performed smoothly. In one embodiment, a plurality of holes 262 may be formed in the metal light shielding layer 260a, and the sizes or the shapes of the holes 262 may be different from each other, as shown in FIG. 2. However, it should be appreciated that embodiments of the present invention are not limited thereto. In another embodiment, the sizes or the shapes of the holes 262 of the metal light shielding layer 260a may be substantially the same.

Figure 4A:
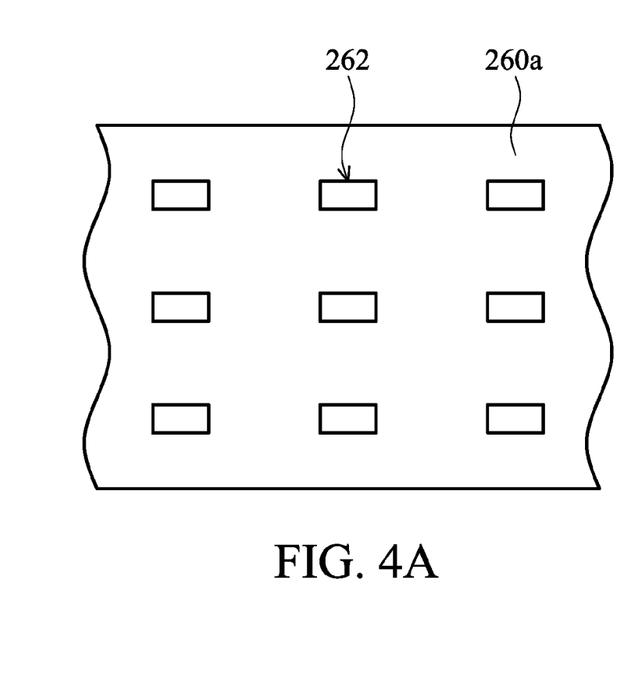
FIGS. 4A and 4B are top views respectively and partially showing chip packages according to embodiments of the invention.
Figure 4B:
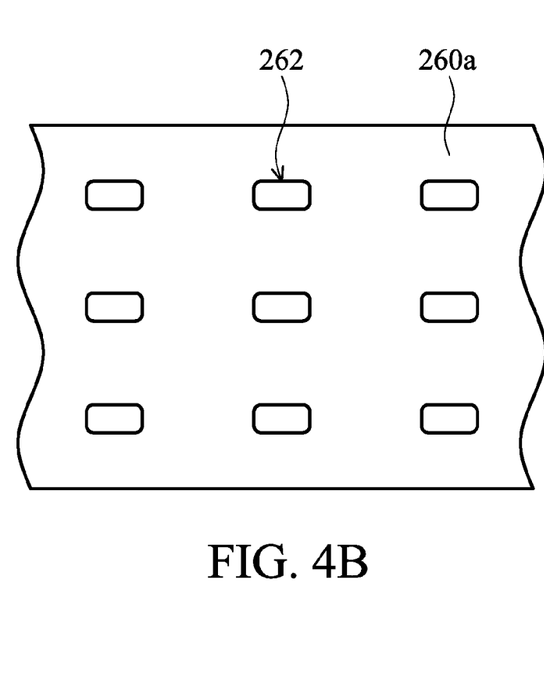

For example, FIGS. 4A and 4B are top views respectively and partially showing chip packages according to embodiments of the invention, wherein the same or similar reference numbers are used to designate the same or similar elements. As shown in FIGS. 4A and 4B, the sizes or the shapes of the holes 262 of the metal light shielding layer 260a are substantially the same, which may be, for example, rectangles or rectangles having at least one rounded corner. In another embodiment, the shape of the hole 262 may be other quadrangles, such as a square, a rhombus, a trapezoid, a parallelogram, or other quadrangles, and may have (but not be limited to) at least one rounded corner, respectively. In one embodiment, the holes 262 of the metal light shielding layer 260a may be distributed in the metal light shielding layer 260a substantially evenly. It should be appreciated that embodiments of the present invention are not limited thereto. In another embodiment, the shape of the hole 262 of the metal light shielding layer 260a may be a triangle, a pentagon, a hexagon, or a heptagon. In one embodiment, the shape of the hole 262 of a pentagon, a hexagon, or a heptagon is not a circle and is a shape having more than eight sides. Therefore, during the etching of the metal layer 117 to form the hole 262, the bubbles generated during the etching of the metal layer 117 is prevented from being adhered on the hole 262 and, being not easily removed, affecting the formation of the hole 262.

Afterwards, referring back to FIG. 1D, in one embodiment, a bonding wire 204 may be formed optionally. The bonding wire 204 may be in electrical contact with the wire layer 118 extending into the recess 130b and/or the recess 130a. In one embodiment, the bonding wire 204 may be in direct contact with the wire layer 118 right above the bottom of the lowest recess (such as the recess 130a) of the recesses, which is the closest to the surface 100b. The bottom of the lowest recess (such as the recess 130a) may be substantially parallel to the surface 100b. The bonding wire 204 may be used to transmit the electrical signal of another electronic element (such as a printed circuit board) to the chip package through the wire layer 118. Afterwards, a dicing process may be performed along the predetermined scribe line SC of the semiconductor substrate 100 to form at least one chip package. Alternatively, in another embodiment, the dicing process of the semiconductor substrate 100 may be performed before the bonding wire 204 is formed.

In the embodiments of the invention, through stacking chips and leading a wire layer into a recess, more conducting paths may be disposed in a limited space, which assists in the size reduction of the chip package. Because the transmittance distance of the wire layer is reduced, the transmittance speed of signals may be improved. In addition, because a solder wire is formed in the recess, the solder wire may be protected by the recess such that the reliability of the chip package is improved. Because the solder wire is formed in the recess, the overall size of the chip package may be reduced. According to the embodiments of the invention, the recesses include a plurality of recesses which connect with each other such that the wire layer is deposited over a smoother profile, which may improve the reliability of the wire layer. The hole of the metal light shielding layer assists in releasing stress in the metal light shielding layer to improve the reliability of the chip package. Through the shape design of the hole of the metal light shielding layer, the fabrication time and the fabrication cost of the chip package may be significantly reduced.

While the disclosure has been described by way of example and in terms of the preferred embodiments, it is to be understood that the disclosure is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
    a semiconductor substrate having a first surface and a second surface;
    a first recess extending from the first surface towards the second surface;
    a second recess extending from a bottom of the first recess towards the second surface, wherein a sidewall and the bottom of the first recess and a second sidewall and a second bottom of the second recess together form an exterior side surface of the semiconductor substrate;
    a wire layer disposed over the first surface and extending into the first recess and/or the second recess;
    an insulating layer positioned between the wire layer and the semiconductor substrate; and
    a metal light shielding layer disposed over the first surface and having at least one hole, wherein a shape of the at least one hole is a quadrangle.

2. The chip package as claimed in claim 1, wherein the quadrangle has at least one rounded corner.

3. The chip package as claimed in claim 1, wherein the quadrangle is a rectangle.

4. The chip package as claimed in claim 1, wherein the at least one hole penetrates through the metal light shielding layer.

5. The chip package as claimed in claim 1, wherein materials of the metal light shielding layer and the wire layer are the same.

6. The chip package as claimed in claim 1, wherein thicknesses of the metal light shielding layer and the wire layer are the same.

7. The chip package as claimed in claim 1, wherein the at least one hole comprises a plurality of holes, and sizes or shapes of the holes are different from each other.

8. The chip package as claimed in claim 1, wherein the at least one hole comprises a plurality of holes, and sizes or shapes of the holes are substantially the same.

9. The chip package as claimed in claim 8, wherein the holes are distributed in the metal light shielding layer substantially evenly.

10. The chip package as claimed in claim 1, further comprising:
    a dielectric layer positioned between the first surface and the insulating layer;
    a device region formed in the semiconductor substrate; and
    a plurality of conducting pads positioned in the dielectric layer, wherein the wire layer is electrically connected to one of the conducting pads.

11. The chip package as claimed in claim 10, wherein a projection of the metal light shielding layer on the first surface is positioned between a projection of the device region on the first surface and a projection of the conducting pads on the first surface.

12. The chip package as claimed in claim 10, wherein the metal light shielding layer is electrically connected to a ground conducting pad in the dielectric layer.

13. The chip package as claimed in claim 1, further comprising a bonding wire electrically contacting the wire layer right above the second bottom of the second recess.

14. The chip package as claimed in claim 1, wherein the wire layer does not electrically contact with the metal light shielding layer.

15. A chip package, comprising:
    a semiconductor substrate having a first surface and a second surface;
    a first recess extending from the first surface towards the second surface;
    a second recess extending from a bottom of the first recess towards the second surface, wherein a sidewall and the bottom of the first recess and a second sidewall and a second bottom of the second recess together form an exterior side surface of the semiconductor substrate;
    a wire layer disposed over the first surface and extending into the first recess and/or the second recess;
    an insulating layer positioned between the wire layer and the semiconductor substrate; and
    a metal light shielding layer disposed over the first surface and having at least one hole, wherein a shape of the at least one hole is a quadrangle, a triangle, a pentagon, a hexagon, or a heptagon.

* * * * *